(12) United States Patent
Frazier

(10) Patent No.: US 7,839,226 B2
(45) Date of Patent: Nov. 23, 2010

(54) METHOD AND APPARATUS FOR EFFECTING STABLE OPERATION OF RESONANT TUNNELING DIODES

(75) Inventor: Gary A. Frazier, Garland, TX (US)

(73) Assignee: Raytheon Company, Waltham, MA (US)

( * ) Notice: Subject to any disclaimer, the term of this patent is extended or adjusted under 35 U.S.C. 154(b) by 797 days.

(21) Appl. No.: 11/779,184

(22) Filed: Jul. 17, 2007

(65) Prior Publication Data

US 2010/0026399 A1 Feb. 4, 2010

Related U.S. Application Data

(60) Provisional application No. 60/807,699, filed on Jul. 18, 2006.

(51) Int. Cl.
*H03B 7/08* (2006.01)
(52) U.S. Cl. .............................. 331/107 T; 331/107 R
(58) Field of Classification Search ............. 331/107 R, 331/107 T
See application file for complete search history.

(56) References Cited

U.S. PATENT DOCUMENTS

| 3,167,663 A * | 1/1965 | Melngailis et al. ........... 327/370 |
| 5,825,240 A | 10/1998 | Geis et al. .................... 327/570 |
| 6,194,303 B1 | 2/2001 | Alphenaar et al. ........... 438/606 |

FOREIGN PATENT DOCUMENTS

| WO | WO 02/056385 A2 | 12/2000 |
| WO | WO 2005/067138 A1 | 12/2003 |

OTHER PUBLICATIONS

PCT Notification of Transmittal of the International Search Report and the Written Opinion of the International Searching Authority or the Declaration; international filed Jul. 18, 2007; international application No. PCT/US2007/073742, 15 pages, Date of mailing: Jul. 3, 2008.
Daniel, Erik S. et al., "Simulations of Electric Field Domain Suppression in a Superlattice Oscillator Device Using a Distributed Circuit Model," XP-002326853; IEEE Transactions on Electron Devices, vol. 50, No. 12; pp. 2434-2444, Dec. 2003.
Ryzhii, V. et al., "Resonant detection and frequency multiplication of terahertz radiation utilizing plasma waves in resonant-tunneling transistors," Journal of Applied Physics, vol. 88, No. 5; pp. 2868-2871, Sep. 1, 2000.

* cited by examiner

*Primary Examiner*—David Mis
(74) *Attorney, Agent, or Firm*—Baker Botts L.L.P.

(57) ABSTRACT

A circuit includes a resonant tunneling device having first and second terminals, and biased to exhibit a negative resistance between the terminals, the terminals being coupled at spaced locations to a further section made of a material which has a plasma resonance tuned to a selected frequency. A different circuit includes a resonant tunneling structure with plural layers, including an outer layer coupled to a further layer made of a material which has a plasma resonance tuned to a selected frequency. Two circuit sections are respectively coupled to the resonant tunneling structure at spaced locations thereon. A bias is applied across the tunneling structure and further layer, and causes the tunneling structure to exhibit a negative resistance.

29 Claims, 4 Drawing Sheets

METHOD AND APPARATUS FOR EFFECTING STABLE OPERATION OF RESONANT TUNNELING DIODES

RELATED APPLICATIONS

This application claims priority under 35 U.S.C. §119(e) of U.S. Provisional Application Ser. No. 60/807,699, entitled "METHOD AND APPARATUS FOR EFFECTING STABLE OPERATION OF RESONANT TUNNELING DIODES," filed Jul. 18, 2006.

GOVERNMENT INTEREST

This invention was made with government support under contract number F33615-99-C-1513. The government has certain rights in this invention.

TECHNICAL FIELD OF THE INVENTION

This invention relates in general to resonant tunneling diodes and, more particularly, to techniques for effecting stable and efficient operation of resonant tunneling diodes.

BACKGROUND OF THE INVENTION

Resonant tunneling diodes (RTDs) exhibit the highest oscillation frequency of any known semiconductor device, for example in excess of 720 GHz. Further, the voltage-current characteristic of an RTD has an operating region in which the RTD effectively exhibits a negative resistance characteristic. In this regard, a positive resistance consumes power, and thus will attenuate an electrical signal. Conversely, a negative resistance essentially represents gain, and is useful in implementing circuits such as an oscillator or an amplifier.

A problem is that, when an RTD is biased to operate at a selected frequency, it usually has a tendency to oscillate at some other undesired frequency, for example due to a parasitic characteristic, such as the inductance in a lead extending to a battery that powers the circuit. One known solution to this instability is to couple a resistor in parallel with the RTD. This approach provides increased stability at frequencies other than the operating frequency. However, at the operating frequency, the positive resistance of the external resistor tends to counteract the negative resistance of the RTD, and thus also tends to counteract the gain characteristic of the RTD. Consequently, the use of an external resistor in this manner is counterproductive to the goal of efficiently exploiting the gain characteristic of the RTD.

A different known approach for stabilizing an RTD is to couple the two conductors at one end of a transmission line to opposite ends of the RTD, and to couple an inductive/capacitive (LC) resonant circuit to the other end of the transmission line. However, for many applications, the use of a transmission line is cumbersome and impractical. This can be true even when the transmission line is implemented as part of the integrated circuit that contains the RTD.

Another consideration is that the output impedance of an RTD drops to a very low value at high operational frequencies. Also, some applications require a power-handling capacity which is in excess of the power-handling capacity of a single RTD. It is possible to couple several RTDs in series, in order to obtain a larger overall impedance and a larger overall power-handling capacity. However, this presents an even greater potential problem for direct current (DC) instability, if the DC bias across the entire string is not divided relatively uniformly among the individual RTDs. A respective resistor can be coupled in parallel with each RTD in the string, in the manner discussed above. These resistors will provide increased stability, and ensure that the DC bias is uniformly allocated among the individual RTDs. However, as also discussed above, the positive resistance of each external resistor will at least partially counteract the negative resistance and associated gain of each RTD at the intended operational frequency, and will thus tend to undermine efforts to optimally and efficiently harness the gain characteristic.

As another alternative, and as noted above, it would theoretically be possible to couple each RTD in the string to a respective different transmission line with a respective resonant circuit. However, where there are several RTDs coupled in series, it is highly impractical to provide a separate transmission line and resonant circuit for each RTD.

SUMMARY OF THE INVENTION

From the foregoing, it may be appreciated that a need has arisen for a method and apparatus for efficiently harnessing the gain which is inherent in a resonant tunneling device, while avoiding undesired instability.

One form of the invention involves: providing a resonant tunneling device having first and second terminals; biasing the resonant tunneling device for operation in a mode which exhibits a negative resistance between the first and second terminals; coupling the first and second terminals to spaced locations on a further section which is made of a material having a plasma resonance; and tuning the plasma resonance of the material to a selected frequency.

A different form of the invention involves: providing a resonant tunneling structure having plural layers, including first and second outer layers; electrically coupling to the first outer layer a further layer which extends parallel to the first outer layer; selecting for the further layer a material which has a plasma resonance; tuning the plasma resonance of the material of the further layer to a selected frequency; applying a bias between a side of the further layer remote from the first outer layer, and a side of the second outer layer remote from the first outer layer, the resonant tunneling structure responding to the bias by exhibiting a negative resistance between the first and second outer layers; and coupling first and second circuit sections to the resonant tunneling structure at respective spaced first and second locations thereon.

BRIEF DESCRIPTION OF THE DRAWINGS

A better understanding of the present invention will be realized from the detailed description which follows, taken in conjunction with the accompanying drawings, in which.

DETAILED DESCRIPTION OF THE INVENTION

Figure 1:
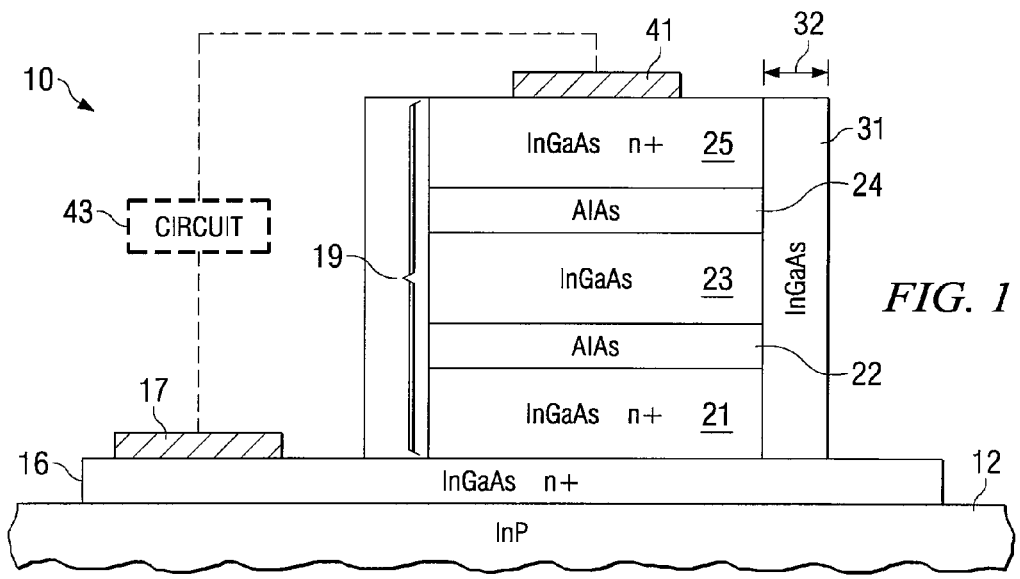
FIG. 1 is a diagrammatic sectional view of an apparatus which is an integrated circuit that includes a resonant tunneling diode, and that embodies aspects of the present invention.

FIG. 1 is a diagrammatic sectional view of an apparatus which is an integrated circuit 10 that embodies aspects of the present invention. The integrated circuit 10 includes a substrate 12, which in the disclosed embodiment is indium phosphide (InP). It should be understood that the specific materials discussed herein for various parts of the integrated circuit 10 are exemplary, and the integrated circuit 10 could be implemented using other materials and/or other semiconductor technologies.

An electrically conductive layer 16 is provided on the top surface of the substrate 12. In the disclosed embodiment, the conductive layer 16 is a doped semiconductor material, and in particular is indium gallium arsenide (InGaAs), which is doped to make it an n+ type semiconductor material. An electrically conductive contact 17 is provided on top of the conductive layer 16 near one side thereof. In the disclosed embodiment, the contact 17 is made from gold.

Near the opposite side of the conductive layer 16, a resonant tunneling diode (RTD) 19 is formed on top of the conductive layer 16. The RTD 19 has an internal configuration of a type which is known in the art. Therefore, this internal configuration is described here only briefly, in order to facilitate an understanding of the present invention. In particular, the internal structure of the RTD 19 includes a stack of five horizontally extending layers 21-25. The outer layers 21 and 25 are each electrically conductive layers in the form of a doped semiconductor material. In the disclosed embodiment, this material is InGaAs, which has been doped to make it an n+ type semiconductor material. The center layer 23 is also made of InGaAs, but is not doped, and is thus not electrically conductive. The layers 22 and 24 are each made of aluminum arsenide (AlAs). The three inner layers 22-24 are thus electrically insulating layers which provide isolation, except to the extent that carriers can tunnel through them between the outer layers 21 and 25, in a known manner.

The RTD 19 is disposed within an annular sleeve 31 made of a semiconductor material, which in the disclosed embodiment is doped InGaAs. The layers 21-25 of the RTD 19 each have a peripheral edge which, along its entire circumference, engages the inner surface of the sleeve 31. The sleeve 31 has a radial thickness which is indicated by reference numeral 32.

An electrical contact 41 is provided on the top surface of the outer layer 25, and in the disclosed embodiment is made of gold. The contacts 17 and 41 are each coupled to a circuit, which is shown diagrammatically at 43. In the disclosed embodiment, the circuit 43 is an integral part of the integrated circuit 10, but the circuit 43 could alternatively be physically separate from the integrated circuit.

Persons skilled in the art will understand that the configuration shown in FIG. 1 is tuned by its physical structure to a single selected operational frequency. Nevertheless, this configuration is advantageous for many applications. For example, it is advantageous for an application in which an oscillator which must produce a single predetermined frequency, or for an application in which a signal at a specific predetermined frequency needs to be amplified.

Figure 2:
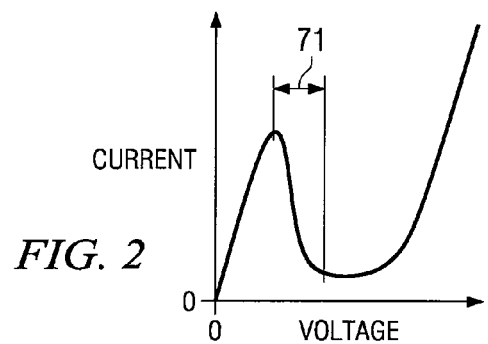
FIG. 2 is a graph depicting a curve that shows how an electrical current through the resonant tunneling diode of FIG. 1 will vary in response to variation of a voltage applied across it.

FIG. 2 is a graph depicting a curve that shows how an electrical current through the RTD 19 will vary in response to variation of a voltage applied across the RTD 19, or in other words a voltage applied between the contacts 17 and 41. It will be noted that the curve has a region 71 where the slope is negative. In effect, this represents a negative resistance characteristic of the RTD 19. A positive resistance will absorb power and thereby attenuate electrical signals. Conversely, a negative resistance such as that shown at 71 represents the opposite of attenuation, or in other words gain. A device with gain can be used to implement a circuit such as an oscillator or amplifier.

The circuit 43 of FIG. 1 includes structure which biases the RTD 19 for operation in its negative resistance region 71. Thus, with reference to FIG. 1, the circuit 43 and the RTD 19 can implement an oscillator or amplifier, as discussed later. An RTD is of particular interest for implementing an oscillator, because RTDs have the highest oscillation frequency of any known semiconductor device, typically on the order of approximately 720 GHz.

However, pre-existing attempts to use an RTD to implement an oscillator or amplifier have been unsuccessful or impractical. This is due in part to the fact that, when an RTD is biased to operate at a selected frequency, it can tend to oscillate at some other undesired frequency, for example due to factors such as the parasitic inductance of a wire coupling the circuit to a battery. Prior attempts to deal with this problem have been ineffective or impractical. As one example, it is possible to provide a resistor in parallel with the RTD. However, while this can help to avoid instability and/or oscillation at frequencies other than the operating frequency, the positive resistance is also effective at the operating frequency and tends to counteract the negative resistance characteristic of the RTD 19. Thus, at the operating frequency, the external positive resistance effectively makes it harder to exploit the RTD gain characteristic which is of interest.

An alternative known approach is to couple the conductors at one end of a transmission line to the outer layers of an RTD, and to couple a capacitance and an inductance to the other end of the transmission line. However, even where such a transmission line can be implemented in the same integrated circuit as the RTD, provision of the transmission line in the integrated circuit is cumbersome at best, and impractical for certain applications.

The embodiment of FIG. 1 takes an approach which is different from these known techniques. In particular, the embodiment of FIG. 1 includes the above-mentioned sleeve 31 of doped semiconductor material, which facilitates efficient and stable operation of the RTD 19. In this regard, the doped semiconductor material of the sleeve 31 has what is commonly known in the art as a plasma frequency or plasma resonance. On the one hand, carriers within the sleeve 31 are subject to a degree of inertia due to their mass, and this resists their movement in a manner which is analogous to the manner in which an inductor will resist the flow of an alternating current through it. The other characteristic underlying plasma resonance is a dielectric relaxation characteristic, where the polarity of charges within the semiconductor material of the sleeve 31 tends to resist movement of a charge cloud within the material. This is somewhat analogous to the manner in which a capacitor responds to an alternating current signal.

To the extent that these two characteristics of plasma resonance are respectively analogous to an inductor and a capacitor, it will be recognized that, much like an LC circuit, they have a resonant frequency. In particular, this resonant frequency is the plasma frequency at which plasma resonance occurs. The level of doping within the semiconductor material of the sleeve 31 is selected to determine the resonant frequency, and in particular to select this resonant frequency to be the same as the desired operational frequency of the RTD 19. Since the layers 22-24 of the RTD 19 are electrically insulating (aside from the tunneling effect), the sleeve 31 looks somewhat like an electrical component which has its opposite ends electrically coupled to the outer layers 21 and 25.

At the resonant frequency, the resonance of the sleeve 31 causes the sleeve to effectively have a very high impedance, and the sleeve is thus electrically negligible at the operating frequency. As a result, the sleeve 31 does not counteract the inherent negative resistance of the RTD 19 at the operating frequency, and thus does not detract from the inherent gain characteristic of the RTD 19 at the operational frequency. Therefore, the circuit 43 can take optimum advantage of the inherent gain of the RTD 19.

With respect to frequencies other than the operating frequency, the semiconductor material of the sleeve 31 will not exhibit the plasma resonance effect. Instead, it will effectively appear to the RTD 19 to be a resistor with its opposite ends coupled to the outer layers 21 and 25. A suitable value for this resistance is determined by appropriate selection of the thickness 32 of the sleeve 31. As discussed above, when a resistance is coupled in parallel with an RTD, it tends to stabilize the RTD 19 and avoid oscillation at frequencies other than the operating frequency. Thus, the sleeve 31 is advantageous at the operating frequency, where the plasma resonance causes it to be electrically transparent so that it does not counteract the negative resistance and associated gain of the RTD 19. Further, the sleeve 31 is advantageous at other frequencies, where the RTD 19 sees the sleeve 31 as a stabilizing resistance.

The embodiment of FIG. 1 includes a single RTD 19. One characteristic of an RTD is that the impedance drops to very low levels at relatively high operational frequencies. There are applications where it is desirable to have a higher impedance and more power-handling capability than can be provided by a single RTD. Consequently, there are applications where it is desirable to couple several RTDs in series, in order to increase the overall impedance at the operational frequency, and in order to provide greater power-handling capability. However, this can produce more complex problems of instability than in the case of a single RTD.

For example, if a direct current bias is provided across the entire string of series-coupled RTDs with no compensation, the bias may not be divided in a uniform and proportional manner among the individual RTDs, which can produce instability. This can be avoided by the above-discussed approach of coupling a separate resistor in parallel with each RTD. However, as also discussed above, such a resistor counteracts the negative resistance and associated gain of the RTD at the operational frequency of interest, and is thus undesirable. As evident from the foregoing discussion, it would theoretically be possible to couple a separate transmission line to each RTD in the string, but this approach is prohibitively impractical in the context of a stack of series-coupled RTDs. On the other hand, the approach according to the invention is highly advantageous and effective when applied to the context of a string of series-coupled RTDs.

Figure 3:
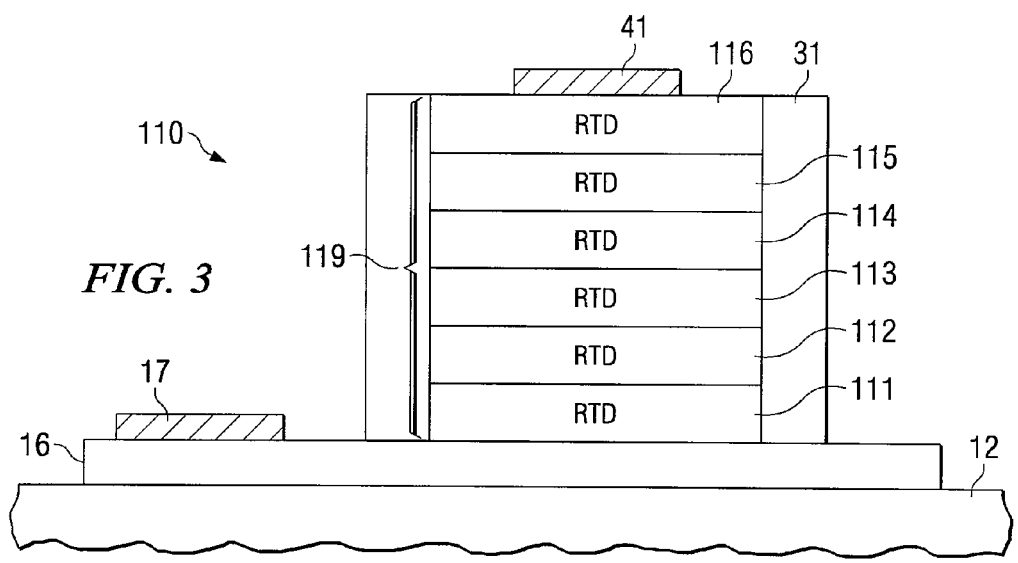
FIG. 3 is a diagrammatic sectional view of an apparatus in the form of integrated circuit, which is an alternative embodiment of the integrated circuit of FIG. 1.

In this regard, FIG. 3 is a diagrammatic sectional view of an apparatus in the form of integrated circuit 110, which embodies aspects of the present invention, and which is an alternative embodiment of the integrated circuit 10 of FIG. 1. In FIGS. 1 and 3, equivalent parts are identified by the same reference numerals, and the following discussion focuses on the differences. In particular, the integrated circuit 110 has a plurality of RTDs 111-116 which are arranged in a vertical stack 119, with the entire stack 119 being disposed within the annular sleeve 31 of doped semiconductor material.

Each of the RTDs 111-116 in FIG. 3 is equivalent in physical structure to the single RTD shown at 19 in FIG. 1. The manner in which the sleeve 31 stabilizes each of the RTDs 111-116 in the stack 119 is effectively equivalent to that described above in association with FIG. 1, and is therefore not described again here in detail.

Figure 4:
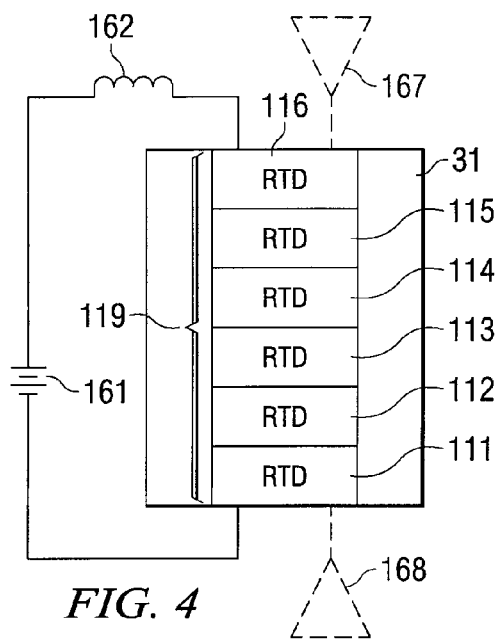
FIG. 4 is a diagrammatic view showing an oscillator which includes a battery, an inductor, and a stack of resonant tunneling diodes from the embodiment of FIG. 3, and also showing a pair of patch antenna elements coupled to opposite ends of the stack.

FIG. 4 is a diagrammatic view showing how the RTD stack 119, a battery 161, and an inductor 162 can be coupled in series with each other, in order to form a stable oscillator. FIG. 4 shows in broken lines how a pair of patch antenna elements 167 and 168 can respectively be coupled to opposite ends of the stack 119, in order to transmit a wireless electromagnetic signal at the frequency of oscillation. The antenna elements 167 and 168 in FIG. 4 effectively form a bipole antenna of a type commonly known as a bowtie antenna, but could alternatively be some other form of antenna.

Figure 5:
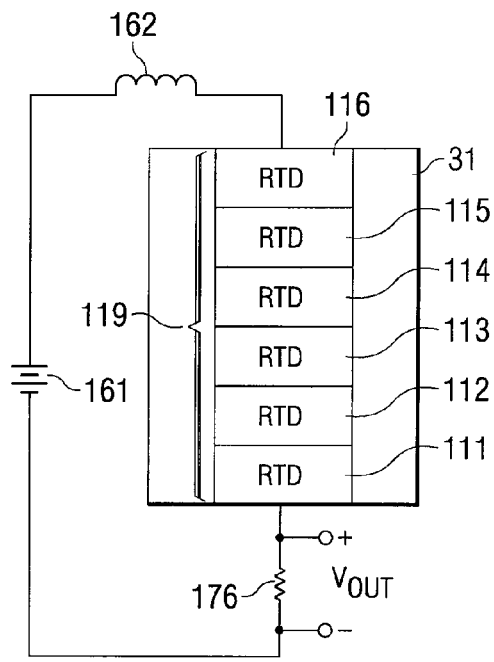
FIG. 5 is a diagrammatic view showing an alternative embodiment of the oscillator of FIG. 4.

FIG. 5 is a diagrammatic view showing how the circuit of FIG. 4 can be modified to add a resistor 176 in series with the battery 161, inductor 162, and RTD stack 119. The voltage $V_{OUT}$ across the resistor 176 serves as an oscillator output signal at the oscillation frequency.

Figure 6:
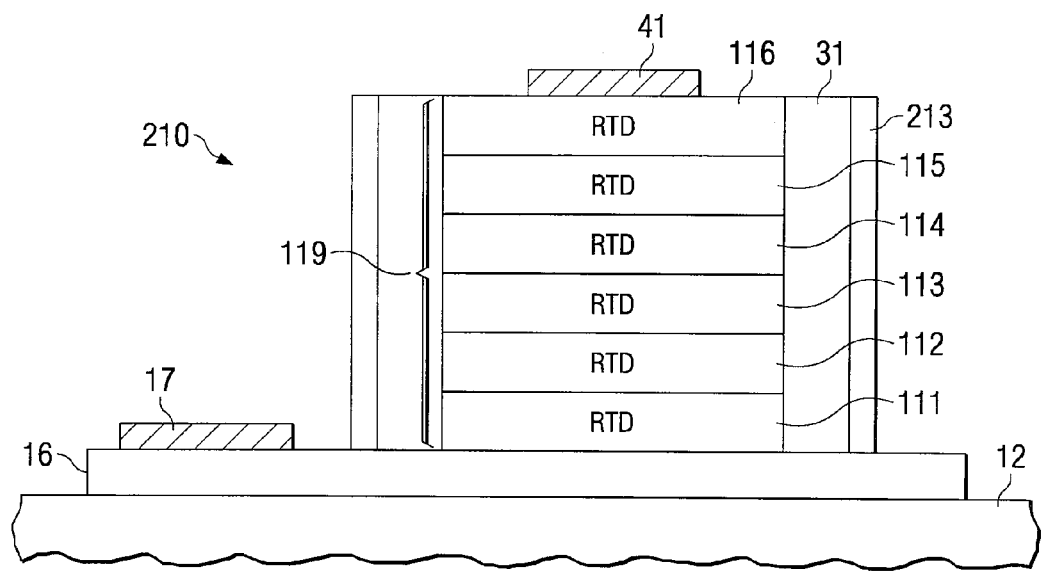
FIG. 6 is a diagrammatic sectional view of an integrated circuit which embodies aspects of the present invention, and which is an alternative embodiment of the integrated circuit of FIG. 3.

FIG. 6 is a diagrammatic sectional view of an integrated circuit 210 which embodies aspects of the present invention, and which is an alternative embodiment of the integrated circuit 110 of FIG. 3. Equivalent parts in FIGS. 3 and 6 are identified with the same reference numerals. The only difference is that an annular sleeve 213 of resistive material has been added around the annular sleeve 31 of doped semiconductor material. The radially inwardly facing surface of the sleeve 213 engages the radially outwardly facing surface of the sleeve 31 along the axial and circumferential extent of both sleeves.

The configuration of FIG. 6 is suitable for an application where, for frequencies other than the operational frequency, it may be difficult to obtain a desired resistance value using only the sleeve 31. More specifically, at the operational frequency, where there is resonance, the outer sleeve 13 looks like a high resistance coupled in parallel with each of the RTDs 111-116 in the stack 119. At other frequencies, the sleeves 31 and 213 look like two resistors coupled in parallel with each of the RTDs 111-116 in the stack 119.

Figure 7:
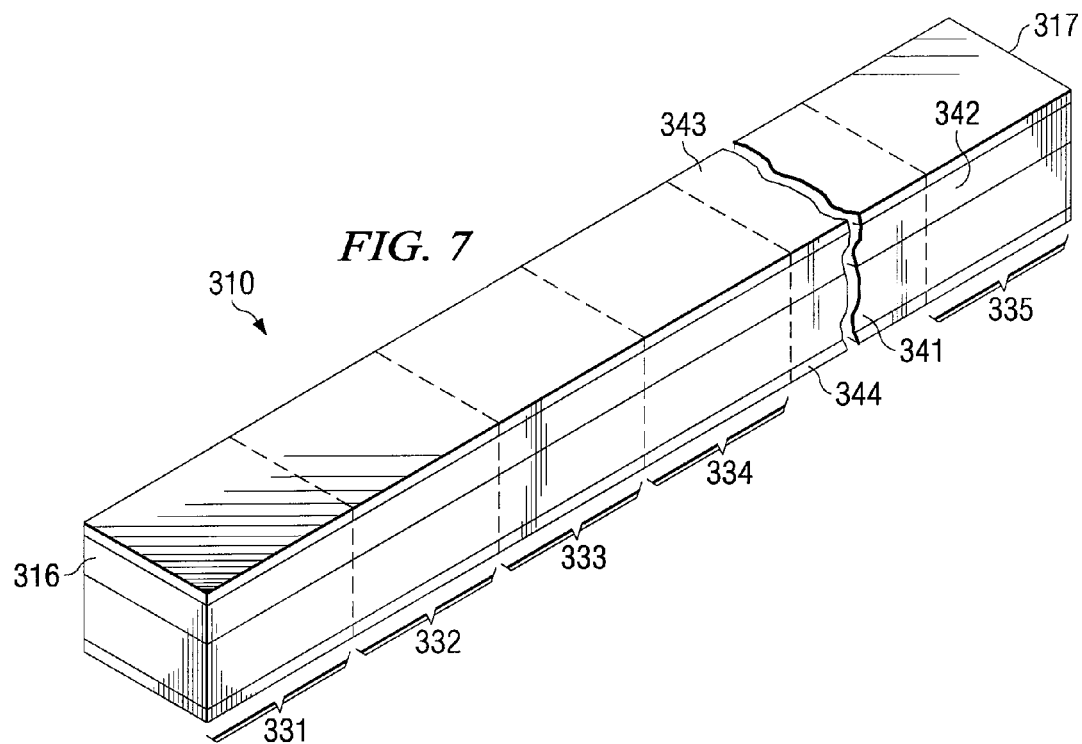
FIG. 7 is a diagrammatic perspective view of an apparatus which is another alternative embodiment of the integrated circuit.

FIG. 7 is a diagrammatic perspective view of an apparatus 310 which is another alternative embodiment that includes aspects of the invention. The apparatus 310 would typically be provided on some form of substrate, but the substrate has been omitted in FIG. 7 for clarity. The apparatus 310 of FIG. 7 is elongate, and has respective ends 316 and 317. The apparatus 310 could have other shapes, but the elongate configuration shown in FIG. 7 facilitates an understanding of the present invention. As indicated by broken lines in FIG. 7, the apparatus 310 can be conceptually subdivided into a plurality of identical sections, several of which are identified by reference numerals 331-335. These sections are discussed later.

The apparatus 310 includes electrically conductive top and bottom layers 343 and 344 which, in the disclosed embodiment, are made of gold. Further, the apparatus 310 includes an RTD section or layer 341, and a plasma resonance layer 342 sandwiched between the top and bottom layers 343 and 344. This structure is discussed in more detail in association with FIG. 8.

Figure 8:
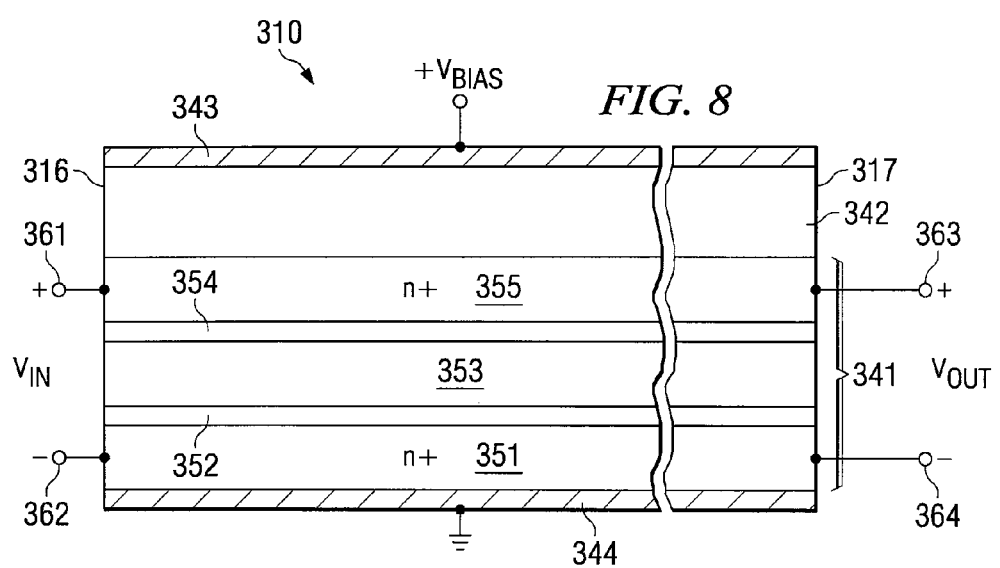
FIG. 8 is a diagrammatic sectional side view of the apparatus of FIG. 7, configured as an amplifier.

More specifically, FIG. 8 is a diagrammatic sectional side view of the apparatus 310 of FIG. 7. As shown in FIG. 8, the RTD section or layer 341 of the apparatus 310 includes five layers 351-355, which are respectively equivalent to the layers shown at 21-25 in FIG. 1. The plasma resonant layer 342 is provided on top of the layer 355. The layer 342 is made of a doped semiconductor material of the same type discussed above in association with sleeve 31 in FIG. 1. The bottom layer 344 is coupled to ground, and the top layer 343 is coupled to a bias voltage +$V_{BIAS}$.

At the end 316 of the apparatus 310, two terminals 361 and 362 of a circuit are respectively coupled to the layers 355 and 351 of the RTD section 341. At the opposite end 317 of the apparatus 310, two further terminals 363 and 364 are coupled to the layers 355 and 351. With reference to the resonant frequency of the plasma resonant layer 342, if an input signal $V_{IN}$ at this frequency is applied between the input terminals 361 and 362, this signal will propagate along the apparatus 310 from the end 316 to the end 317, and will appear in amplified form between the output terminals 363 and 364 as an output signal $V_{OUT}$. Thus, in effect, the apparatus 310 of FIGS. 7 and 8 forms a tuned, active transmission line.

Figure 9:
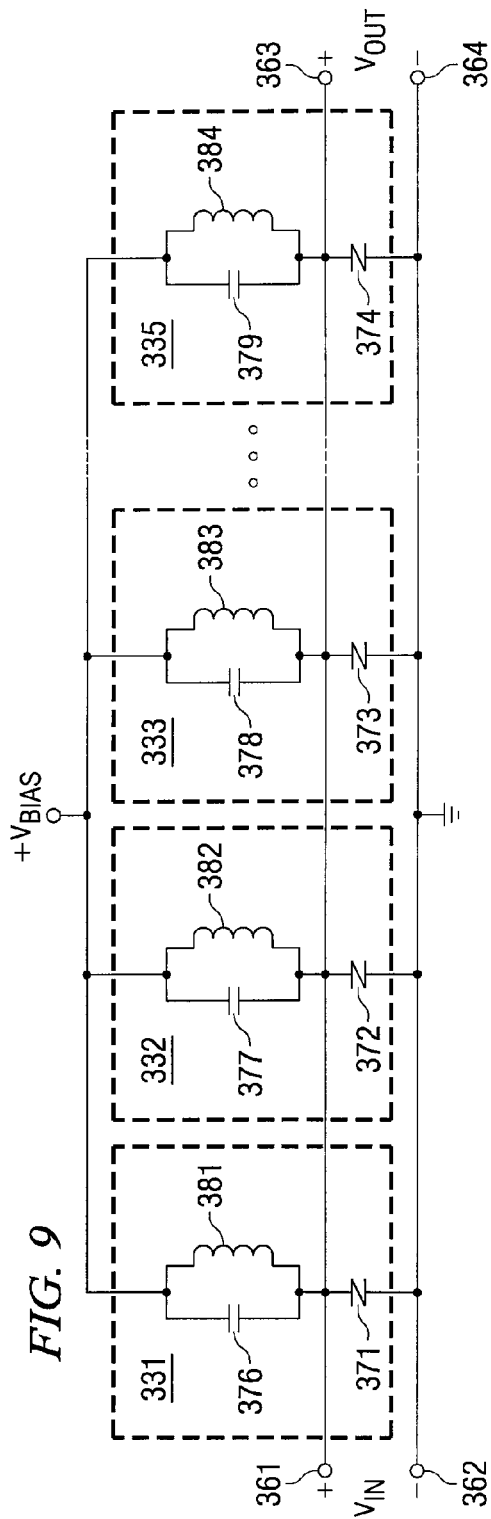
FIG. 9 is a schematic diagram of an equivalent circuit for the apparatus of FIGS. 7 and 8.

In order to better understand this, it is helpful to remember that, as discussed above in association with FIG. 7, the elongate apparatus 310 can be conceptually viewed as a plurality of identical sections, five of which are shown at 331-335. FIG. 9 is a schematic diagram of an equivalent circuit for the apparatus 310, and has respective portions which, as indicated by broken lines, respectively correspond to the sections 331-335 of the apparatus 310. The plasma resonance of the single semiconductor layer 342 is represented diagrammatically in FIG. 9 by a series of capacitors 376-379 and inductors 381-384, which are arranged to form a respective LC circuit within each of the sections 331-335. Similarly, the RTD section or layer 341 is represented diagrammatically by a plurality of RTDs 371-374, each of which is disposed within a respective one of the sections 331-335.

When an electromagnetic wave propagates through the apparatus 310 from the input terminals 361 and 362 to the output terminals 363 and 364, it gains energy within each of the sections 331-335 by effectively pumping the plasma resonance, due to the fact that the gain of the RTD structure is sufficient to offset the losses in the plasma resonance material. It will be recognized that the apparatus 310 is a very narrowband device, which is tuned by virtue of its physical structure to a specific frequency. However, it will also be recognized that there are applications which are inherently restricted to a specific frequency, and in which a device of this type is highly advantageous.

Figure 10:
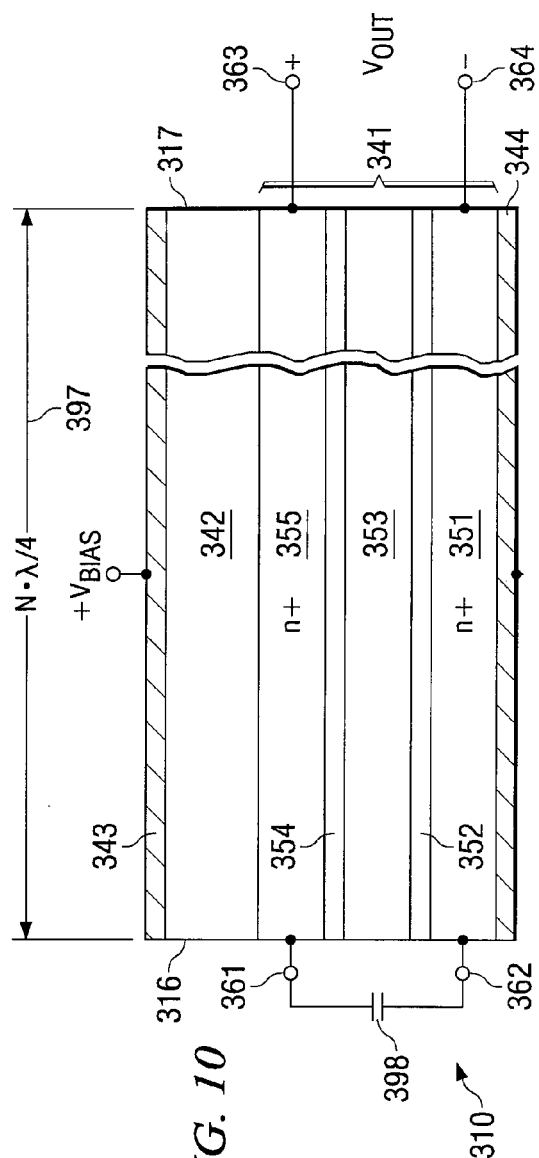
FIG. 10 is a diagrammatic sectional side view of the apparatus of FIG. 7, configured as an oscillator.

FIG. 10 is a diagrammatic sectional view which is similar to FIG. 8, but which shows a different application for the apparatus 310. The basic difference is that, in FIG. 8, the apparatus 310 was configured to serve as an active transmission line or amplifier. In contrast, in FIG. 10, the apparatus 310 is configured to serve as an oscillator. In this regard, the length 397 between the ends 316 and 317 of the apparatus 310 is selected to have a value of N·λ/4, where N is an integer and λ is the plasma frequency of the plasma resonant layer 342. This makes it possible for a standing wave to exist within the apparatus 310 at the plasma frequency. In addition, a capacitor 398 is coupled between the input terminals 361 and 362, with a capacitance value selected so that a signal at the plasma frequency will see the input terminals 361 and 362 as effectively being electrically shorted. With this configuration, the apparatus 310 will produce at the output terminals 363 and 364 an output signal $V_{OUT}$ having a frequency which is the same as the plasma frequency.

The present invention provides a number of advantages. One advantage is that, through use of the plasma resonance of a doped semiconductor material, one or more RTDs can be stabilized at frequencies other than an operating frequency which is the plasma frequency, and can also function at the operating frequency without counteracting the negative resistance and its associated gain characteristic. This approach is significantly superior in performance to all other known approaches, and involves a structural configuration which is very simple and inexpensive. It provides a practical and reliable technique for permitting the inherent gain of an RTD to be used for applications such as an amplifier or oscillator, especially for applications involving operational frequencies higher than the upper limits of other known circuit components which have gain. Further, by providing a reliable and practical technique for coupling multiple RTDs in series, power-handling capability and overall impedance can each be increased to levels which are suitable for certain applications in which the impedance and power-handling capability of a single RTD are inadequate.

According to a different advantage, a sandwich structure involving an RTD structure and a plasma resonance layer can be used to implement an oscillator, or a tuned, active transmission line. In each configuration, the inherent gain of the RTD structure can be efficiently used for amplification or oscillation, especially at high frequencies which are in excess of the operating limits of other known devices that have gain.

Although selected embodiments have been illustrated and described in detail, it will be understood that various substitutions and alterations are possible without departing from the spirit and scope of the present invention, as defined by the following claims.

What is claimed is:

1. An apparatus comprising a circuit which includes:
   a resonant tunneling device having first and second terminals;
   a bias section biasing said resonant tunneling device for operation in a mode which exhibits a negative resistance between said first and second terminals; and
   a further section made of a material which has a plasma resonance tuned to a selected frequency, said first and second terminals of said resonant tunneling device being coupled to said further section at spaced locations thereon.

2. An apparatus according to claim 1, wherein said material of said further section is a semiconductor material which has a level of doping selected to tune said plasma resonance thereof to said selected frequency.

3. An apparatus according to claim 1, wherein said resonant tunneling device is a resonant tunneling diode.

4. An apparatus according to claim 3,
   wherein said resonant tunneling diode has a plurality of layers, including spaced layers which have peripheral edges and which respectively serve as said first and second terminals thereof; and
   wherein said further section has an annular shape and has said resonant tunneling diode disposed therein, said further section electrically engaging said peripheral edges of said spaced layers of said resonant tunneling diode.

5. An apparatus according to claim 4,
wherein said material of said further section is a semiconductor material which has a level of doping selected to tune said plasma resonance thereof to said selected frequency; and
wherein said further section has a radial thickness selected so that, at a frequency substantially lower than said selected frequency, said further section provides a selected resistance between said first and second terminals of said resonant tunneling diode.

6. An apparatus according to claim 5, including a sleeve-like section which is made of a resistive material and which extends around said further section in electrical engagement therewith.

7. An apparatus according to claim 3, wherein said circuit includes a plurality of further resonant tunneling diodes which each have first and second terminals coupled to said further section at spaced locations thereon, said resonant tunneling diodes all being coupled in series with each other, and said bias section biasing each of said resonant tunneling diodes for operation in a mode which exhibits a negative resistance between said first and second terminals thereof.

8. An apparatus according to claim 7,
wherein said series-coupled resonant tunneling diodes are arranged in a stack;
wherein each said resonant tunneling diode has a plurality of layers, including spaced layers which have peripheral edges and which respectively serve as said first and second terminals thereof; and
wherein said further section has an annular shape and has said stack disposed therein, said further section electrically engaging said peripheral edges of said spaced layers of each said resonant tunneling diode in said stack.

9. An apparatus according to claim 8,
wherein said material of said further section is a semiconductor material which has a level of doping selected to tune said plasma resonance thereof to said selected frequency; and
wherein said further section has a radial thickness selected so that, at a frequency substantially lower than said selected frequency, said further section provides a selected resistance between said first and second terminals of each said resonant tunneling diode.

10. An apparatus according to claim 9, including a sleeve-like section which is made of a resistive material and which extends around said further section in electrical engagement therewith.

11. An apparatus according to claim 1, wherein said circuit effects amplification as a function of gain derived from said negative resistance of said resonant tunneling device.

12. An apparatus according to claim 1, wherein said circuit effects oscillation as a function of gain derived from said negative resistance of said resonant tunneling device.

13. An apparatus comprising a circuit which includes:
a resonant tunneling structure having a plurality of layers, including first and second outer layers;
a further layer extending parallel to and electrically coupled to said first outer layer, said further layer being made of a material which has a plasma resonance tuned to a selected frequency;
a bias section providing a bias between a side of said further layer remote from said first outer layer, and a side of said second outer layer remote from said first outer layer, said resonant tunneling structure being responsive to said bias for exhibiting a negative resistance between said first and second outer layers; and
first and second circuit sections which are respectively coupled to said resonant tunneling structure at spaced first and second locations thereon.

14. An apparatus according to claim 13, wherein said material of said further layer is a semiconductor material which has a level of doping selected to tune said plasma resonance thereof to said selected frequency.

15. An apparatus according to claim 13,
wherein said further layer is disposed on said first outer layer;
including a first electrically conductive layer disposed on a side of said further layer remote from said first outer layer; and
including a second electrically conductive layer disposed on a side of said second outer layer remote from said first outer layer, said bias section applying a bias voltage between said first and second electrically conductive layers.

16. An apparatus according to claim 13,
wherein said resonant tunneling structure and said further layer are elongate; and
wherein said first and second locations are at opposite ends of said resonant tunneling structure.

17. An apparatus according to claim 13, wherein said circuit effects amplification as a function of gain derived from said negative resistance of said resonant tunneling structure.

18. An apparatus according to claim 13, wherein said circuit effects oscillation as a function of gain derived from said negative resistance of said resonant tunneling structure.

19. A method comprising:
providing a resonant tunneling device having first and second terminals;
biasing said resonant tunneling device for operation in a mode which exhibits a negative resistance between said first and second terminals;
coupling said first and second terminals to spaced locations on a further section which is made of a material having a plasma resonance; and
tuning said plasma resonance of said further section to a selected frequency.

20. A method according to claim 19,
including selecting as said material of said further section a semiconductor material; and
herein said tuning includes selecting a level of doping of said semiconductor material to tune said plasma resonance thereof to said selected frequency.

21. A method according to claim 19, including selecting a resonant tunneling diode as said resonant tunneling device.

22. A method according to claim 19, including effecting amplification of a signal as a function of gain derived from said negative resistance of said resonant tunneling device.

23. A method according to claim 19, including effecting oscillation of a signal as a function of gain derived from said negative resistance of said resonant tunneling device.

24. A method comprising:
providing a resonant tunneling structure having a plurality of layers, including first and second outer layers;
electrically coupling to said first outer layer a further layer which extends parallel to said first outer layer;
selecting as a material for said further layer a material which has a plasma resonance;
tuning said plasma resonance of said material of said further layer to a selected frequency;
applying a bias between a side of said further layer remote from said first outer layer, and a side of said second outer layer remote from said first outer layer, said resonant tunneling structure responding to said bias by exhibiting a negative resistance between said first and second outer layers; and coupling first and second circuit sections to said resonant tunneling structure at respective spaced first and second locations thereon.

25. A method according to claim 24, including selecting a semiconductor material as said material of said further layer; and wherein said tuning includes selecting a level of doping of said semiconductor material to tune said plasma resonance thereof to said selected frequency.

26. A method according to claim 24, including selecting a resonant tunneling diode to serve as said resonant tunneling device.

27. A method according to claim 24, including configuring said resonant tunneling structure and said further layer to be elongate, and to have said first and second locations at opposite ends of said resonant tunneling structure.

28. A method according to claim 24, including effecting amplification of a signal as a function of gain derived from said negative resistance of said resonant tunneling structure.

29. A method according to claim 24, including effecting oscillation of a signal as a function of gain derived from said negative resistance of said resonant tunneling structure.

* * * * *